United States Patent [19]

Ohmine et al.

[11] Patent Number: 5,088,444
[45] Date of Patent: Feb. 18, 1992

[54] VAPOR DEPOSITION SYSTEM

[75] Inventors: Toshimitsu Ohmine, Tokyo; Keiichi Akagawa, Yamato, both of Japan

[73] Assignee: Kabushiki Kaisha Toshiba, Kawasaki, Japan

[21] Appl. No.: 487,188

[22] Filed: Mar. 1, 1990

[30] Foreign Application Priority Data

Mar. 15, 1989 [JP] Japan .................................. 1-060824

[51] Int. Cl.$^5$ ............................................. C23C 16/00
[52] U.S. Cl. ..................................... 118/719; 118/715; 118/725
[58] Field of Search .................... 118/715, 719, 725

[56] References Cited

U.S. PATENT DOCUMENTS

| 4,268,538 | 5/1981 | Toole | 427/255 |
| 4,709,655 | 12/1987 | Van Mastrigt | 118/725 |
| 4,883,020 | 11/1989 | Kasai | |

FOREIGN PATENT DOCUMENTS 152363 11/1981 Fed. Rep. of Germany .

Primary Examiner—Richard Bueker
Attorney, Agent, or Firm—Foley & Lardner

[57] ABSTRACT

A vapor deposition system deposits a semiconductor film on a substrate. The system comprises a susceptor on which the substrate is positioned, and a reactor tube in which the susceptor having the substrate is positioned and the semiconductor film is deposited on the substrate. The reactor tube is composed of two parts to be fitted to and separated from each other. An airtight vessel airtightly covers the reactor tube. The system further comprises a mover for moving at least one of the two parts of the reactor tube relative to the other part, thereby fitting and separating the two parts to and from each other. A carrying device is provided for the system to carry the susceptor having the substrate from the airtight vessel into the reactor tube through an opening to be opened by separating the two parts of the reactor tube from each other, and to carry the susceptor from the reactor tube to the airtight vessel through the opening.

13 Claims, 5 Drawing Sheets

VAPOR DEPOSITION SYSTEM

BACKGROUND OF THE INVENTION

1. Field of the Invention

The present invention relates to a vapor deposition system adopted for manufacturing semiconductors, and particularly to a vapor deposition system having improved reliability and safety.

2. Description of the Prior Art

FIG. 1 shows an example of conventional vapor deposition system for depositing compound semiconductor material on a substrate to form a compound semiconductor file on the substrate.

In the figure, the system comprises a reactor tube 100, a reactor chamber 101 formed inside the reactor tube 100, a susceptor 103 on which a substrate 102 is placed, and a support rod 104 for removably supporting the susceptor 103. The support rod 104 is movably inserted into the reactor tube 100 which is kept airtight by a bellows 105 attached to the bottom of the reactor tube 100. The support rod 104 is moved vertically by a raiser 116.

The reactor tube 100 comprises an upper part 100a made of glass and a lower part 100b made of metal. The upper and lower parts 100a and 100b are airtightly connected to each other at flange portions 100c through an O-ring 106. The upper part 100a has an inlet 100d for supplying gases such as material gases, carrier gases and inert gases into the reactor chamber 101. The lower part 100b has an exhaust port 100e for discharging non-reacted gases from the reactor chamber 101 and adjusting a pressure of the reactor chamber 101. A high-frequency coil 107 is disposed around the reactor chamber 101 to heat the same.

A preparatory chamber 109 is formed beside the lower part 100b of the reactor tube 100. The preparatory chamber 109 can communicate with the reactor chamber 101 through a gate valve 108. In the preparatory chamber 109, a susceptor receptor receiver 110 is movable in the direction of an arrow mark A. The susceptor receiver 110 is connected to a moving rod 112, which is connected to a mover 115. A bellows 111 maintains airtightness between the preparatory chamber 109 and the moving rod 112.

The susceptor receiver 110 is moved by the moving rod 112 and mover 115 into the reactor chamber 101 through the gate valve 108, thereby bringing a susceptor placed on the susceptor receiver 110 from the preparatory chamber 109 to the support rod 104 as well as bringing them from the support rod 104 into the preparatory chamber 109.

A lid 114 is removably arranged on the preparatory chamber 109 through an O-ring 113. An exhaust port 109a is formed on the bottom of the preparatory chamber 109 to discharge non-reacted gases from the preparatory chamber 109 and adjust an internal pressure thereof.

To position the substrate 102 in the reactor chamber 101, the gate valve 108 between the reactor chamber 101 and the preparatory chamber 109 is firstly closed, and the lid 114 of the preparatory chamber 109 is opened. Thereafter, the substrate 102 is put on the susceptor 103 that has been positioned on the susceptor receiver 110 in advance. The lid 114 is closed, and the same gases (inert gases) as those supplied to the reactor chamber 101 are supplied to the preparatory chamber 109 through an inlet (not shown), thereby filling the preparatory chamber 109 and reactor chamber 101 with the same gases. A pressure of the preparatory chamber 109 is adjusted to be equal to that of the reactor chamber 101. The gate valve 108 is then opened, and the susceptor receiver 110 is moved by the mover 115 to the support rod 104 which has been brought to a lower position by the raiser 116 in advance. The susceptor 103 with the substrate 102 is transferred onto the support rod 104. Thereafter, the support rod 104 is raised by the raiser 116.

The susceptor receiver 110 is returned to the preparatory chamber 109 by the moving rod 112 and mover 115, and the gate valve 108 is closed. The high-frequency coil 107 is activated to heat the susceptor 103, thereby increasing a temperature of the substrate 102 to a predetermined value. Material gases such as arsine ($AsH_3$), trimethylgallium (TMG) and trimethylaluminum (TMA) and carrier gases such as $H_2$ are supplied into the reactor chamber 101 through the inlet 100d. Consequently, a compound semiconductor film is deposited on the substrate 102.

To take the substrate 102 having the deposited compound semiconductor film out of the reactor chamber 101, the material and carrier gases, are stopped at first. Residual gases are discharged by a rotary pump (not shown) from the reactor chamber 101 through the exhaust port 100c. Inert gases are supplied into the reactor chamber 101 through the inlet 100d to set a pressure of the reactor chamber 101 to be equal to that of the preparatory chamber 109. The gate valve 108 is opened. The susceptor receiver 110 is moved by the moving rod 112 and mover 115, and positioned below the susceptor 103 and substrate 102 in the reactor chamber 101. The support rod 104 is lowered by the raiser 116 to transfer the susceptor 103 and substrate 102 to the susceptor receiver 110, which is then moved by the moving rod 112 and mover 115 to the preparator chamber 109. The gate valve 108 is closed, an the lid 114 is opened to pick up the substrate 102 from the susceptor 103 that is on the susceptor receiver 110.

The above conventional vapor deposition system has the following problems:

(a) Not all of the material gases supplied to the reaction chamber 101 necessarily contribute to form the compound semiconductor film on the substrate 102. A portion of the gases that did not contribute to the film deposition may form reactive products, which gather below the susceptor 103 and largely adhere to the gate valve 108 positioned beside the lower part of the reactor chamber 101. The adhered reactive products cause the gate valve 108 not to be closed completely, and a leak of the gases and reactive products occurs. The gases are usually harmful and flammable, and therefore, if the gases or reactive products escape from the reactor chamber 101 into the preparatory chamber 109 through the gate valve 108 during the deposition process or when the substrate 102 is taken out from the preparatory chamber 109, they may cause explosion, fire, damage to humans, etc. Moreover, since a breakage of the reactor tube 100 and a deterioration of the O-ring 106 will cause harmful gases to leak out of the reaction chamber, avoidance of such a result is highly desirable.

(b) The susceptor 103 and susceptor receiver 110 are moved in the direction A through the gate valve 108 between the reactor chamber 101 and the preparatory chamber 109. This enlarges the size of the system (including the mover 115) in the direction A. In addition, the gate valve 108 shall be sufficiently large to pass the susceptor receiver 110. This may greatly increase vibration of the gate valve 108 in opening and closing the same. The vibration will cause the reactive products adhered to an inner wall of the reactor tube 100 to drop on the substrate 102, thereby abnormally growing the film on the substrate 102.

(c) Since the susceptor receiver 110 can move only in the direction A, the susceptor 103 on the support rod 104 shall be moved vertically by the raiser 116. Namely, the support rod 104 shall be moved vertically to transfer the susceptor 103 between the support rod 104 and the susceptor receiver 110. This complicates the structure of the raiser 16 which is usually equipped with a mechanism for rotating the susceptor 103.

(d) The reactor tube 100 comprises the upper and lower parts 100a and 100b that are tightly fixed to each other by the flange portions 100c through the O-ring 106. When phosphorous gases such as phosphine gases are supplied to the reactor chamber 101, the gases will react with a very small amount of air penetrated through the flange portions 100c to form phosphoric acid, which will corrode the O-ring 106 and cause a leakage.

SUMMARY OF THE INVENTION

To solve the above problems, an object of the present invention is to provide a vapor deposition system having improved reliability and safety.

Another object of the present invention is to provide a compact vapor deposition system.

Still another object of the invention is to provide a vapor deposition system having no device for lifting a susceptor vertically in a reactor chamber.

In order to accomplish the objects, a vapor deposition system according to the present invention comprises a susceptor for supporting a substrate, a reactor tube divided into two parts for accommodating the susceptor, a support rod for supporting the susceptor in the reactor tube, lifting means for vertically moving one of the two parts of the reactor tube, an airtight vessel for covering the reactor tube, carrying means for carrying the substrate or the susceptor with the substrate between the airtight vessel and the reactor tube through an opening to be formed between the two parts of the reactor tube, and heating means for heating the susceptor.

Since the reactor tube is airtightly covered by the airtight vessel, gases are not leaked out of the airtight vessel even if the gases escape from the reactor tube. Since the reactor tube is dividable into the two parts, the substrate can be transferred easily to and from the reactor tube. This makes the system compact.

These and other objects, features and advantages of the present invention will be more apparent from the following detailed description of preferred embodiments in conjunction with the accompanying drawings.

DETAILED DESCRIPTION OF THE EMBODIMENTS

Figure 1:
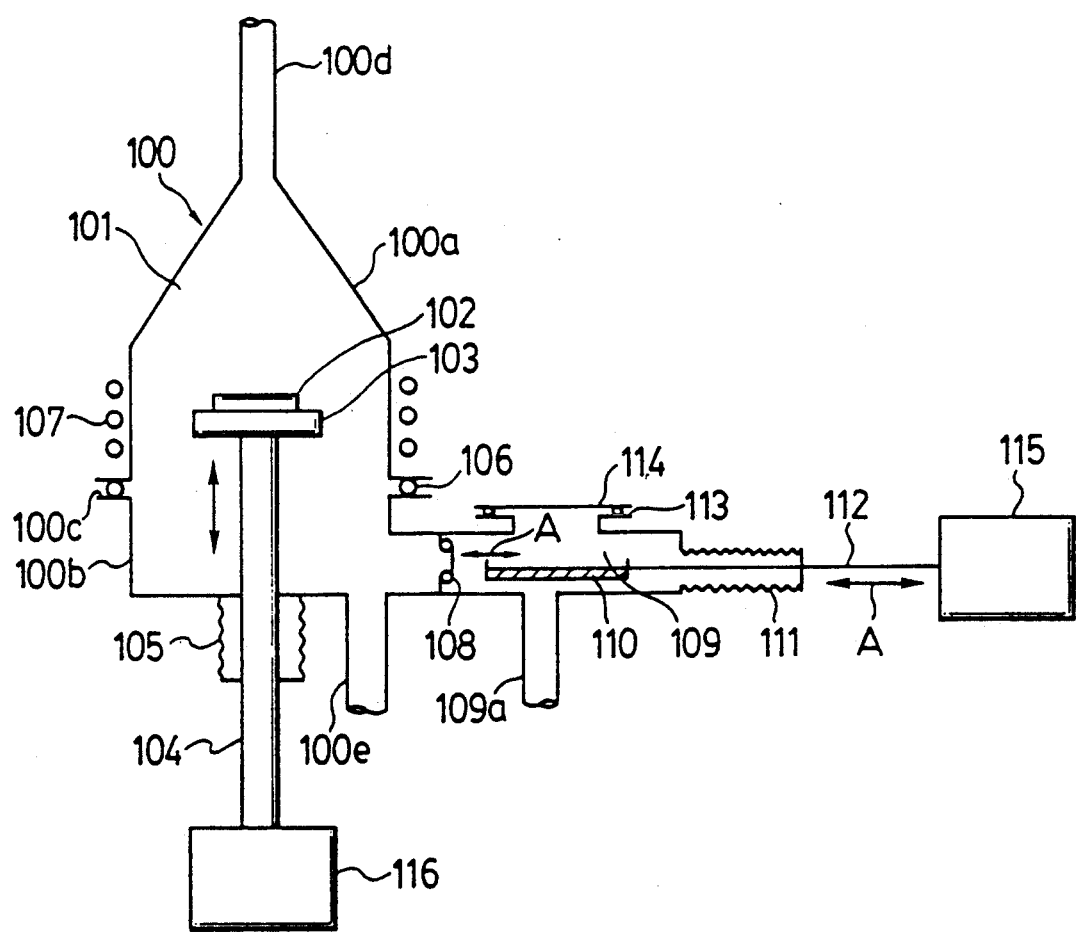
FIG. 1 is a sectional view showing a conventional vapor deposition system.
Figure 2:
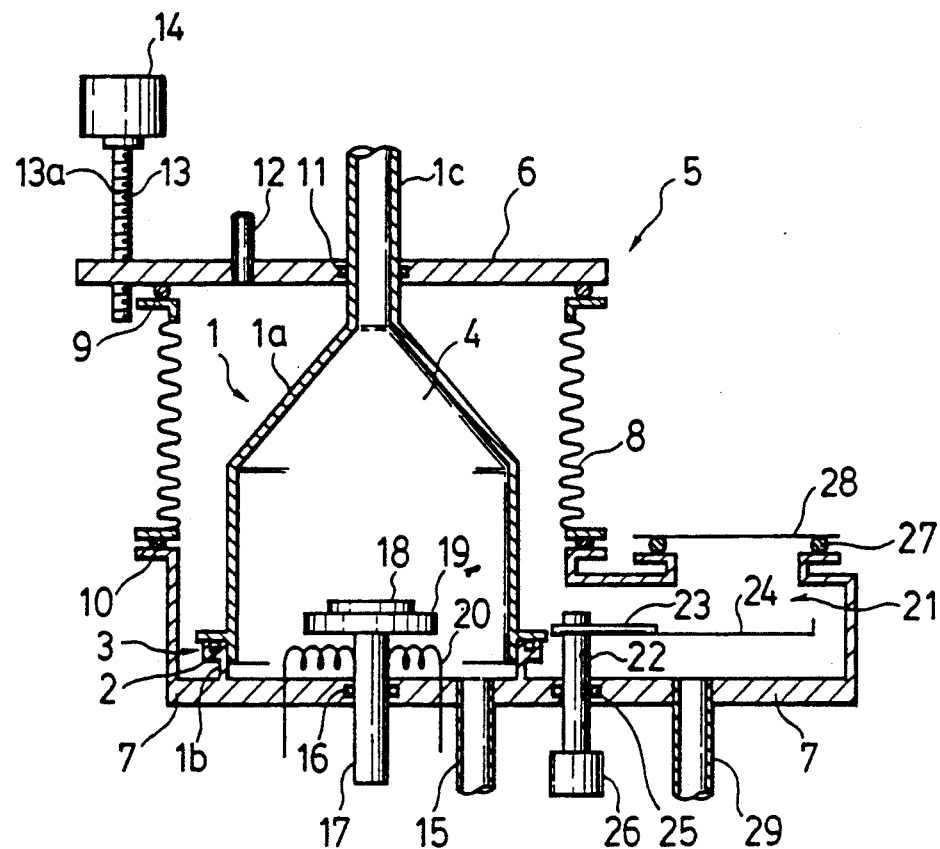
FIG. 2 is a sectional view showing a vapor deposition system according to a first embodiment of the invention.
Figure 3:
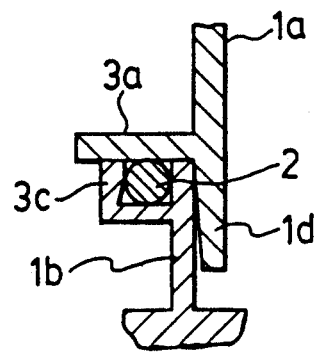
FIG. 3 is an enlarged sectional view showing part of the vapor deposition system of FIG. 2.
Figure 4:
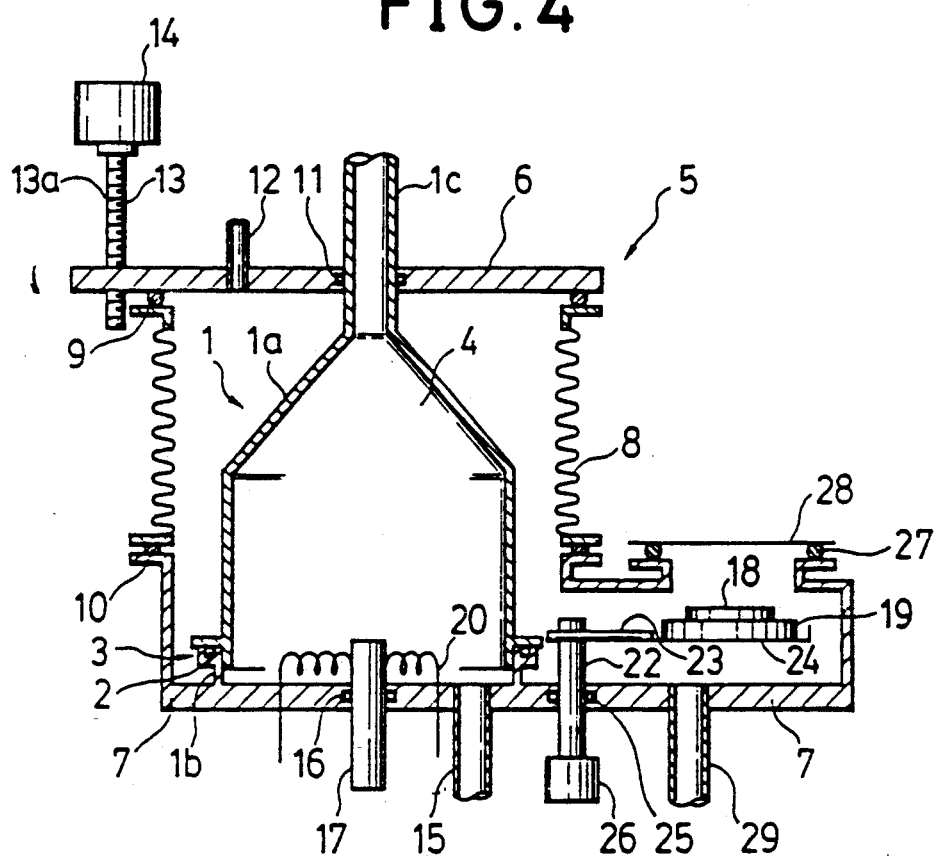
FIGS. 4 and 5 are sectional views showing an operation of bringing a susceptor with a substrate into a reactor tube of the vapor deposition system of FIG. 2.

FIGS. 2 to 4 are sectional views showing a vapor deposition system according to the first embodiment of the invention.

The system comprises a reactor tube 1 to be dividable into an upper part 1a and a lower part 1b, which are removably fitted to each other by a connection portion 3 through an O-ring 2. The upper part 1a has an inlet 1c for supplying gases such as material gases, carrier gases and inert gases into a reaction chamber 4 formed inside the reactor tube 1.

As shown in FIG. 3, the connection portion 3 surely fits the upper and lower part 1a and 1b of the reactor tube 1 to each other. The connection portion 3 comprises a first projection 3a protruding from the upper part 1a, and a second projection 3b protruding from the lower part 1b and holding the O-ring 2. An edge 1d of the upper part 1a is tapered to tightly fit with the lower part 1b. An edge 3c of the second projection 3b is reversely tapered to securely hold the O-ring 2.

An airtight vessel 5 covers the reactor tube 1 airtightly, and comprises an upper plate 6, a lower plate 7, and a bellows 8 disposed on the peripheries of the upper and lower plates 6 and 7. An O-ring 9 is disposed between the upper plate 6 and the bellows 8, and an O-ring 10 between the lower plate 7 and the bellows 8, to maintain airtightness.

The inlet 1c of the reactor tube 1 is airtightly fixed to the upper plate 6 through an O-ring 11. The lower part 1b of the reactor tube 1 is fixed to an inner fact of the lower plate 7. Namely, the lower plate 7 of the airtight vessel 5 and the lower part 1b of the reactor tube 1 are solidly formed.

The upper plate 6 has a supply conduit 12 for supplying gases such as purge gases into the airtight vessel 5. The upper plate 67 also has a rotary shaft 13. The rotary shaft 13 vertically moves the upper plate 6 and bellows 8, thereby vertically moving the upper part 1a of the reactor tube 1 fixed to the upper plate 6, and thus opening and closing the connection portion 3 of the reactor tube 1. The rotary shaft 13 has a feeding thread 13a engaging with the upper plate 6. A motor 14 is connected to the rotary shaft 13 to drive the rotary shaft 13 and vertically move the upper plate 6 together with the bellows 8 and the upper part 1a of the reactor tube 1.

An exhaust conduit 15 is connected to the lower plate 7 at lower part of the reactor chamber 4. The exhaust conduit 15 adjusts a pressure of the reactor chamber 4, and exhausts gases supplied from the inlet 1c. A support rod 17 is rotatably inserted into the reactor chamber 4 through the lower plate 7. A slide ring 16 is disposed between the lower plate 7 and the support rod 17. A susceptor 19 for placing a substrate 18 thereon is removably arranged on the support rod 17. The top of the support rod 17 where the susceptor 19 is arranged is positioned substantially at the level of the connection portion 3 where the reactor tube 1 is dividable into the upper and lower parts 1a and 1b.

A motor (not shown) for rotating the support rod 17 is connected to a lower end of the support rod 17. A heater 20 for heating the substrate 18 is disposed around the support rod 17.

A preparatory chamber 21 is defined in the airtight vessel 5 by the lower plate 7 and a side face of the reactor tube 1. In the preparatory chamber 21, there are disposed a rotary shaft 22, an arm 23 attached to the rotary shaft 22, and a susceptor receiver 24 attached to an end of the arm 23. These rotary members 22, 23 and 24 carry the susceptor 19 and substrate 18 between the reactor chamber 4 and the preparatory chamber 21 through an opening to be formed at the connection portion 3 of the reactor tube 1.

The rotary shaft 22 is rotatably and vertically movably inserted into the lower plate 7 through a slide ring 25. A lower end of the rotary shaft 22 is connected to a motor 26 for rotating the rotary shaft 22 and to a lifting mechanism (not shown) for vertically moving the rotary shaft 22.

A lid 28 is removably and airtightly fitted to the top of the preparatory chamber 21 through an O-ring 27. An exhaust conduit 29 is connected to the bottom of the preparatory chamber 21 to discharge gases such as purge gases and inert gases supplied to the airtight vessel 5 and preparatory chamber 21.

An operation of the first embodiment of the invention will be explained.

The upper part 1a of the reactor tube 1 is lowered, and the upper and lower parts 1a and 1b of the reactor tube 1 are tightly fitted to each other through the connection portion 3. The lid 28 of the preparatory chamber 21 is opened, and a susceptor 19 on which a substrate 18 is placed is positioned on the susceptor receiver 24. The lid 28 is tightly closed, and gases are discharged from the airtight vessel 5 and preparatory chamber 21 through the exhaust conduit 29 as shown in FIG. 4.

The same gases (inert gases) as those filled in the reactor chamber 4 are supplied into the airtight vessel 5 through the supply conduit 12, thereby equalizing pressures in the reactor chamber 4, airtight vessel 5 and preparatory chamber 21.

Figure 5:
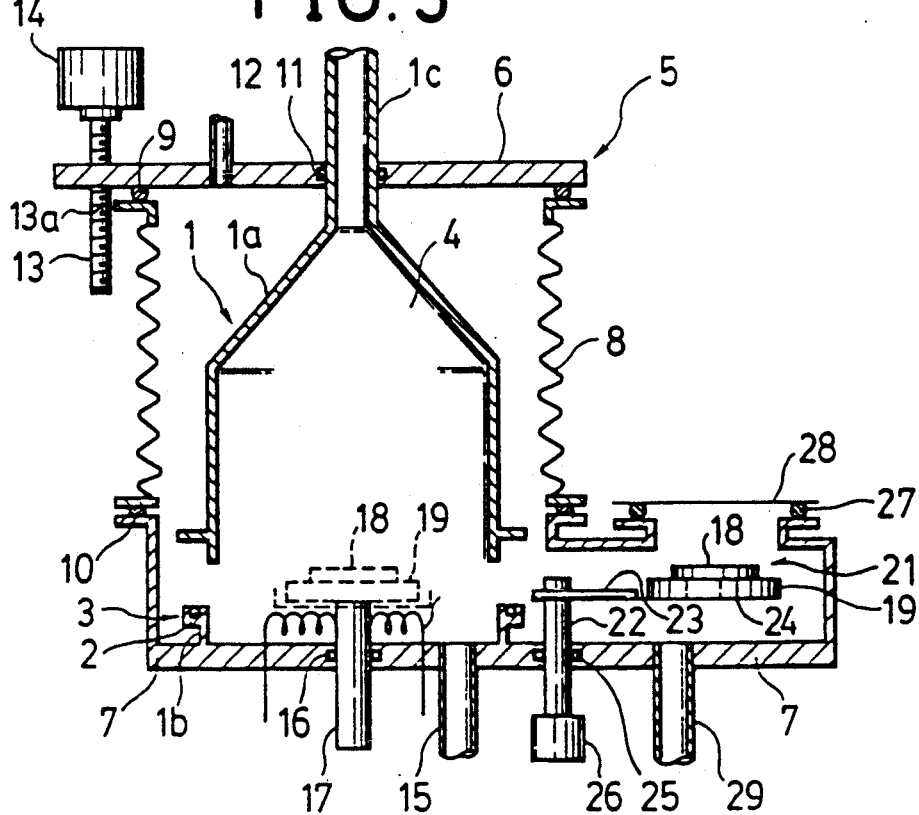

The motor 14 is driven to turn the rotary shaft 13, thereby lifting the upper plate 6. This causes the upper part 1a of the reactor tube 1 fixed to the upper plate 6 to rise apart from the lower part 1b. Simultaneously, the bellows 8 is extended, and the connection portion 3 between the upper and lower parts 1a and 1b of the reactor tube 1 is opened as shown in FIG. 5. At this time, the first projection 3a of the connection portion 3 never brings the O-ring 2 therewith, because the O-ring 2 is secured by the reversely tapered edge 3c of the lower part 1b.

After the connection portion 3 is opened, the motor 26 is driven to turn the rotary shaft 22 to bring the arm 23 and susceptor receiver 24 from the preparatory chamber 21 to the support rod 17 in the reactor chamber 4. The rotary shaft 22 is then lowered by the lifting mechanism (not shown) to transfer the susceptor 19 with the substrate 18 onto the support rod 17.

The motor 26 is driven to turn the rotary shaft 22 and return the arm 23 and susceptor receiver 24 into the preparatory chamber 21.

The motor 14 is driven to reversely turn the rotary shaft 13 to lower the upper plate 6, thereby lowering the upper part 1a of the reactor tube 1 fixed to the upper plate 6 and tightly fitting the upper part 1a to the lower part 1b through the connection portion 3. At this time, the bellows 8 is contracted to its original position as shown in FIG. 2.

Non-corrosive purge gases are supplied into the airtight vessel 5 through the supply conduit 12, and the heater 20 is activated to heat the reactor chamber 4. After a temperature of the substrate 18 is increased to a predetermined value, material gases such as arsine ($AsH_3$), trimethylgallium (TMG) and trimethylaluminum (TMA), and carrier gases such as $H_2$ are supplied to the reactor chamber 4 through the inlet 1c. Consequently, a compound semiconductor film is deposited on the substrate 18.

A portion of the material gases that has not contributed for the film deposition on the substrate 18 forms reactive products at lower part of the reactor chamber 4 in the lower part 1b of the reactor tube 1. The reactive products will never adhere to the connection portion 3 between the upper and lower parts 1a and 1b of the reactor tube 1. The reactive products may be collected by a collector (not shown) from the exhaust conduit 15, so that the reactive products may not enter the preparatory chamber 21 when the connection portion 3 is opened by lifting the upper part 1a of the reactor tube 1.

After the compound semiconductor film is deposited on the substrate 18, inert gases are supplied to the reactor tube 1, airtight vessel 5 and preparatory chamber 21 from the inlet 1c and supply conduit 12 to form an atmospheric pressure.

The motor 14 is driven to turn the rotary shaft 13, thereby lifting the upper plate 6 and the upper part 1a of the reactor tube 1 fixed to the upper plate 6 and opening the connection portion 3. The bellows 8 is extended at this time.

The motor 26 is driven to turn the rotary shaft 22, thereby bringing the arm 23 and susceptor receiver 24 from the preparatory chamber 21 to the support rod 17 through the opened connection portion 3. The rotary shaft 22 is then lifted by the lifting mechanism (not shown) to transfer the susceptor 19 having the substrate 18 from the support rod 17 onto the susceptor receiver 24. The motor 26 is again driven to bring the susceptor receiver 24 having the susceptor 19 into the preparatory chamber 21.

The motor 14 is driver to reversely turn the rotary shaft 13 to lower the upper plate 6 and the upper part 1a of the reactor tube 1 fixed to the upper plate 6, thereby tightly fitting the upper part 1a to the lower part 1b through the connection portion 3. The bellows 8 is contracted at this time.

The lid 28 of the preparatory chamber 21 is opened, and the substrate 18 is picked up.

According to this system, the reactive products do not adhere to the connection portion 3 between the tightly fitted upper and lower parts 1a and 1b of the reactor tube 1. Since the reactor tube 1 is covered with the airtight vessel 5, air does not penetrate to reach the O-ring 2 of the connection portion 3. This prevents the corrosion and leakage of the O-ring 2, even when phosphorus gases such as phosphine gases are supplied to the reactor chamber 4. Even if the gases leak from the reactor chamber 4 through the connection portion 3, the leaked gases never escape outside the airtight vessel 5 because the airtight vessel 5 is filled with non-corrosive purge gases.

The above embodiment has only one rotary shaft 13 for moving the upper plate 6, the upper part 1a of the reactor tube 1 and the bellows 8. Two or more rotary shafts may be arranged for moving these members.

In the above embodiment, the susceptor 19 with the substrate 18 is put on the susceptor receiver 24 and then transferred onto the support rod 17 in the reactor chamber 4. The susceptor 19 may be fitted on the support rod 17 in advance, and the substrate 18 may be put on the susceptor receiver 24 and transferred onto the susceptor 19.

In the above embodiment, the arm 23 having the susceptor receiver 24 is rotated to transfer the susceptor 19 having the substrate 18 to and from the support rod 17 in the reactor chamber 4. The arm 23 having the susceptor receiver 24 may be linearly moved to transfer the susceptor 19 having the substrate 18 to and from the support rod 17 in the reactor chamber 4.

The lower part 1b of the reactor tube 1 has been explained as solidly connected to the lower plate 7 of the airtight vessel 5. Instead, part of the lower plate 7 may be considered to form a lid for opening and closing an opening of the reactor tube 1.

Figure 6:
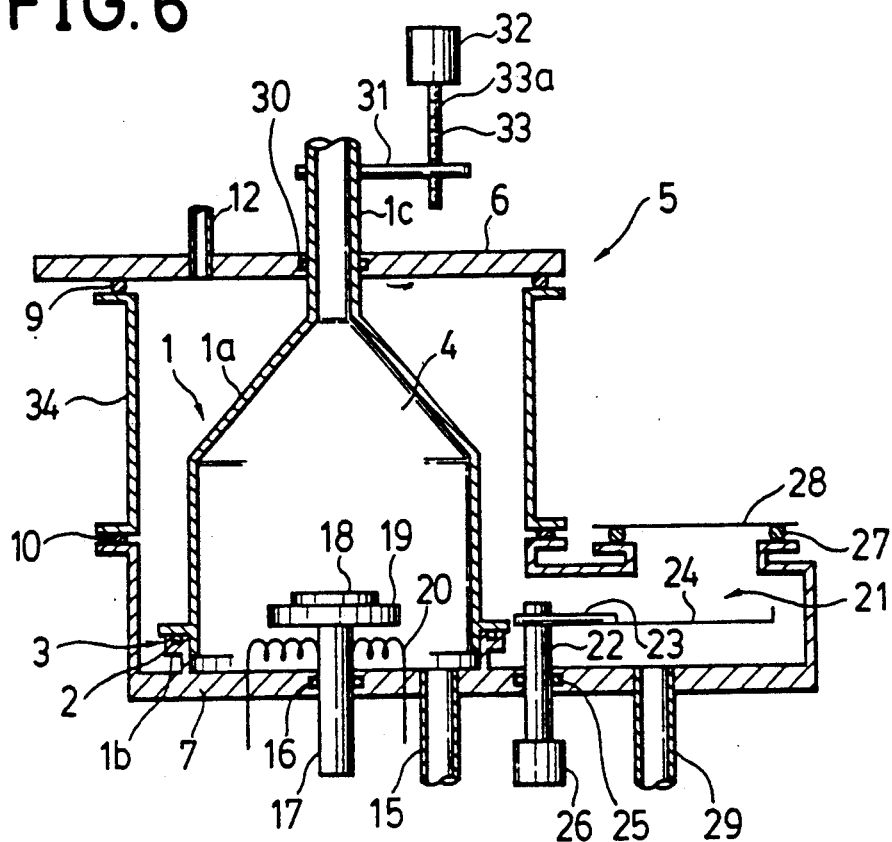
FIG. 6 is a sectional view showing a vapor deposition system according to a second embodiment of the invention.

FIG. 6 is a sectional view showing a vapor deposition system according to the second embodiment of the invention.

Instead of providing the rotary shaft 13 having the motor 14 for the upper plate 6 of the first embodiment, an inlet 1c of an upper part 1a of a reactor tube 1 of the second embodiment is airtightly and movably inserted into an upper plate 6 through a slide ring 30. A connection plate 31 is fitted to upper part of the inlet 1c. The connection plate 31 is engaged with a feeding thread 33a of a rotary shaft 33, which is connected to a motor 32. An airtight vessel 5 has a cylindrical sidewall 34. Other arrangements of the second embodiment are the same as the arrangements of the first embodiment.

According to the second embodiment, the motor 32 is driven to turn the rotary shaft 33, thus moving the connection plate 31 up or down. Accordingly, the upper part 1a of the reactor tube 1 is moved up or down in the airtight vessel 5. Similar to the first embodiment, a susceptor 19 having a substrate 18 is carried by carrying means comprising a rotary shaft 22, an arm 23, a susceptor receiver 24 and a motor 26.

Figure 7:
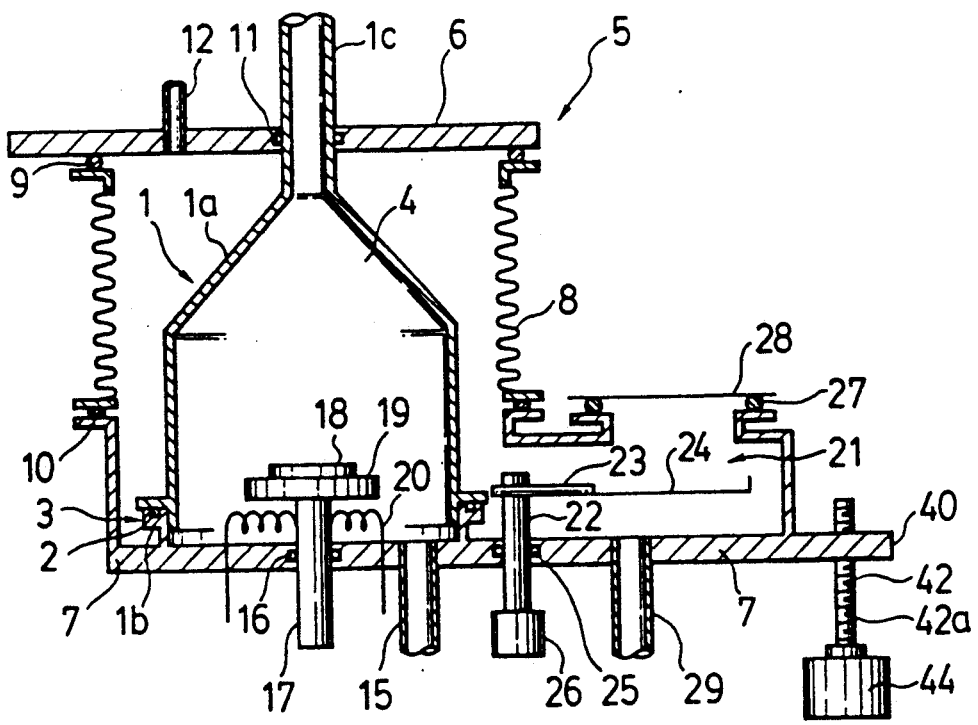
FIG. 7 is a sectional view showing a vapor deposition system according to a third embodiment of the invention.

FIG. 7 is a sectional view showing a vapor deposition system according to the third embodiment of the invention.

Instead of providing the rotary shaft 13 having the motor 14 for the upper plate 6 of the first embodiment, an end of a lower plate 7 of the third embodiment has a projection 40 with which a feeding thread 42a of a rotary shaft 42 to vertically move the lower plate 7 together with a lower part 1b of a reactor tube 1, a support rod 17, a rotary shaft 22 and a preparatory chamber 21. Other arrangements of the third embodiment are the same as the arrangements of the first embodiment.

According to the third embodiment, the motor 44 is driven to turn the rotary shaft 42, thereby vertically moving the projection 40. Accordingly, the lower part 1b of the reactor tube 1 is vertically moved relative to an upper part 1a and an upper plate 6 in an airtight vessel 5. Similar to the previous embodiments, a susceptor 19 having a substrate 18 is carried by carrying means comprising a rotary shaft 22, an arm 23, a susceptor receiver 24 and a motor 26.

Figure 8:
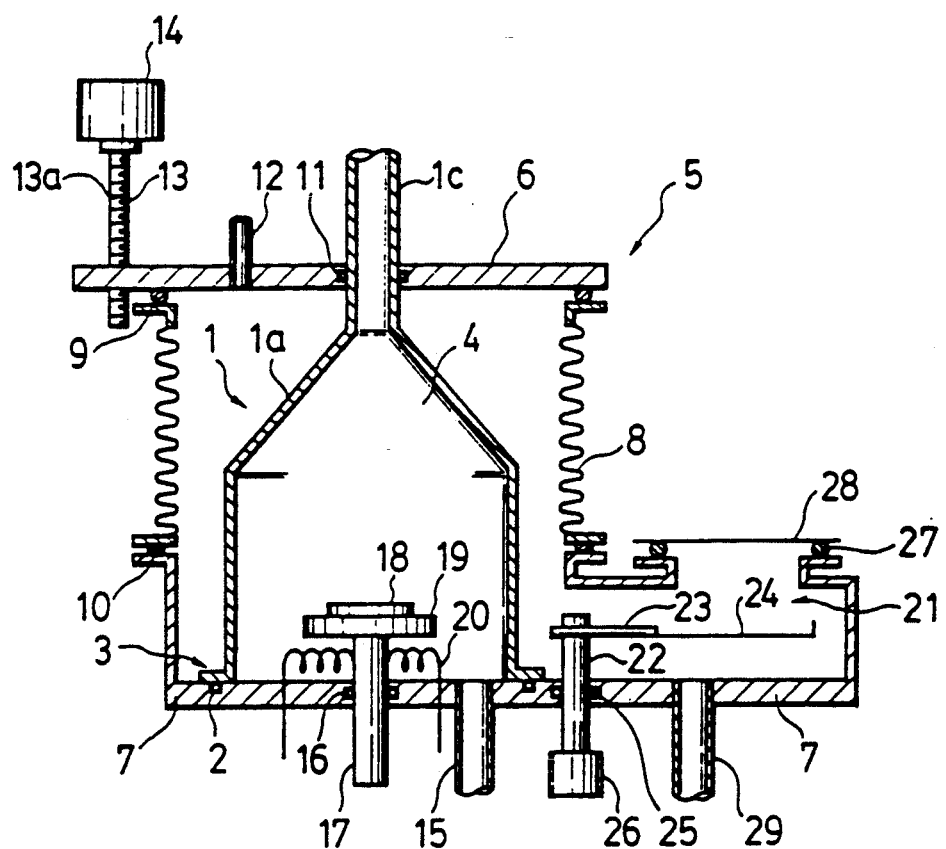
FIG. 8 is a sectional view showing a vapor deposition system according to a fourth embodiment of the invention.

FIG. 8 is a sectional view showing a vapor deposition system according to the fourth embodiment of the invention.

In this embodiment, elements same as the elements in the first embodiment shown in FIG. 2 have numbers same as that of the elements in the first embodiment and the detailed explanation thereof is omitted.

In this embodiment, the O-ring Z is provided in the lower plate 7 whereas the reactor tube 1 is dividable into the upper part 1a and a lower part 1b in the above mentioned embodiments. Namely, in this embodiment, the reactor tube 1 is dividable into the upper part 1a and the lower plate 7 and part of the lower plate 7 may be considered to form a part of the reactor tube 1.

The phrase of reactor tube composed of two parts which is claimed is interpreted as the above mentioned broad meaning and this embodiment support the broad meaning.

In summary, according to a vapor deposition system of the invention, one of two parts forming a reactor tube of the system is moved relative to the other part, so that a substrate or a susceptor having a substrate may be easily and surely brought to and from the reactor tube through an opening to be formed between the two parts. The reactor tube is covered with an airtight vessel, so that gases in the reactor tube may be prevented from leaking outside the airtight vessel. This improves reliability and safety of the system.

Various modifications will become possible for those skilled in the art after receiving the teachings of the present disclosure without departing from the scope thereof.

What is claimed is:

1. A vapor deposition system for depositing a semiconductor film on a substrate, comprising:
   (a) a susceptor on which the substrate is positioned;
   (b) a reactor tube in which said susceptor having the substrate is positioned and the semiconductor film is deposited on the substrate;
   (c) said reactor tube being composed of two parts to be fitted to and separated from each other;
   (d) an airtight vessel airtightly covering said reactor tube;
   (e) moving means disposed outside of said airtight vessel for moving at least one of the two parts of said reactor tube relative to the other part, thereby fitting and separating the two parts to and from each other; and
   (f) carrying means for carrying said susceptor having the substrate from said airtight vessel into said reactor tube through an opening to be opened by separating the two parts of said reactor tube from each other, and carrying said susceptor from said reactor tube to said airtight vessel through the opening.

2. The vapor deposition system as claimed in claim 1, wherein the two parts of said reactor tube are an upper part and a lower part, and said moving means comprises a mover disposed outside of said airtight vessel for vertically moving one of the upper and lower parts of said reactor tube.

3. The vapor deposition system as claimed in claim 2, wherein said reactor tube is separable substantially at a level where said susceptor is positioned in said reactor tube.

4. The vapor deposition system as claimed in claim 1, further comprising:
   a support rod for supporting said susceptor in said reactor tube; and
   heating means for heating said susceptor.

5. A vapor deposition system for depositing a semiconductor film on a substrate, comprising:
   (a) a susceptor on which the substrate is positioned;
   (b) a reactor tube in which said susceptor having the substrate is positioned and the semiconductor film is deposited on the substrate;
   (c) said reactor tube being composed of two parts to be fitted to and separated from each other;
   (d) an airtight vessel airtightly covering said reactor tube;
   (e) moving means disposed outside of said airtight vessel for moving at least one of the two parts of said reactor tube relative to the other part, thereby fitting and separating the two parts to and from each other; and
   (f) carrying means for carrying said susceptor having the substrate from said airtight vessel into said reactor tube through an opening to be opened by separating the two parts of said reactor tube from each other, and carrying said susceptor from said reactor tube to said airtight vessel through the opening;
   wherein the two parts of said reactor tube are an upper part and a lower part,
   the periphery of said airtight vessel comprises an extensible bellows, the upper part of said reactor tube is airtightly passed through and fixed to the top of said airtight vessel, and said moving means comprises a mover for vertically moving one of the upper and lower parts of said reactor tube with the bellows being extended and contracted.

6. The vapor deposition system as claimed in claim 5, wherein the bottom of said airtight vessel is formed integrally with the lower part of said reactor tube.

7. The vapor deposition system as claimed in claim 5, wherein the upper part of said reactor tube is airtightly and movably passed through the top of said airtight vessel, and the mover vertically moves the upper part of said reactor tube within said airtight vessel.

8. A vapor deposition system for depositing a semiconductor film on a substrate, comprising:
   (a) a susceptor on which the substrate is positioned;
   (b) reactor tube in which said susceptor having the substrate is positioned and the semiconductor film is deposited on the substrate;
   (c) said reactor tube being composed of two parts to be fitted to and separated from each other;
   (d) an airtight vessel airtightly covering said reactor tube;
   (e) moving means disposed outside of said airtight vessel for moving at least one of the two parts of said reactor tube relative to the other part, thereby fitting and separating the two parts to and from each other; and
   (f) carrying means for carrying said susceptor having the substrate from said airtight vessel into said reactor tube through an opening to be opened by separating the two parts of said reactor tube from each other, and carrying said susceptor from said reactor tube to said airtight vessel through the opening,
   wherein the two parts of said reactor tube are an upper part and a lower part,
   the periphery of said airtight vessel comprises an extensible bellows, the upper part of said reactor tube is airtightly passed through and fixed to the top of said airtight vessel, and said moving means comprises a mover for vertically moving one of the upper and lower parts of said reactor tube, with the bellows being extended and contracted.

9. The vapor deposition system as claimed in claim 8, wherein the bottom of said airtight vessel is formed integrally with the lower part of said reactor tube.

10. The vapor deposition system as claimed in claim 5, wherein said airtight vessel is fixed and said mover is constructed for vertically moving said reactor tube only.

11. The vapor deposition system as claimed in claim 5, wherein said carrying means comprises a rotatable and vertically movable rotary shaft, an arm fitted to the rotary shaft, and a receiver fitted to an end of the arm, for receiving at least one of said susceptor and the substrate.

12. The vapor deposition system as claimed in claim 4, wherein the heating means comprises a heater arranged in said reactor tube to heat the periphery of the support rod and the lower face of said susceptor.

13. A vapor deposition system for depositing a semiconductor film on a substrate, comprising:
   (a) a susceptor on which the substrate is positioned;
   (b) a reactor tube in which said susceptor having the substrate is positioned and the semiconductor film is deposited on the substrate;
   (c) said reactor tube having an opening through which said susceptor is brought in and out said reactor tube;
   (d) an airtight vessel airtightly covering said reactor tube;
   (e) said airtight vessel having a moving portion to close and open the opening of said reactor tube;
   (f) moving means disposed outside of said airtight vessel for moving the moving portion of said airtight vessel to open and close the opening of said reactor tube; and
   (g) carrying means for carrying said susceptor having the substrate from said airtight vessel into said reactor tube through an opening of said reactor tube, and carrying said susceptor from said reactor tube to said airtight vessel through the opening.

* * * * *